(12) United States Patent
Koh et al.

(10) Patent No.: US 10,903,592 B2
(45) Date of Patent: Jan. 26, 2021

(54) MEMORY CARD AND ELECTRONIC APPARATUS INCLUDING THE SAME

(71) Applicant: Samsung Electronics Co., Ltd., Suwon-si (KR)

(72) Inventors: Seung-wan Koh, Hwaseong-si (KR); Seok-heon Lee, Suwon-si (KR); Seok-jae Han, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/445,935

(22) Filed: Jun. 19, 2019

(65) Prior Publication Data

US 2019/0305453 A1 Oct. 3, 2019

Related U.S. Application Data

(63) Continuation of application No. 16/125,895, filed on Sep. 10, 2018, now Pat. No. 10,374,342.

(30) Foreign Application Priority Data

Jan. 4, 2018 (KR) .................. 10-2018-0001384

(51) Int. Cl.
*H01R 12/71* (2011.01)
*H05K 1/11* (2006.01)
(Continued)

(52) U.S. Cl.
CPC ....... *H01R 12/714* (2013.01); *H01R 12/7005* (2013.01); *H01R 13/245* (2013.01);
(Continued)

(58) Field of Classification Search
CPC .......... H01R 12/714; G06K 19/07732; G06K 19/07743; H05K 2201/09827; H05K 2201/09863
See application file for complete search history.

(56) References Cited

U.S. PATENT DOCUMENTS 4,054,742 A * 10/1977 Bonhomme ........... H05K 1/117
174/261
6,060,665 A * 5/2000 Daoud ................. H05K 1/0216
174/250
(Continued)

FOREIGN PATENT DOCUMENTS

JP 4628183 B2 2/2011
KR 10-1430406 B1 8/2014
(Continued)

*Primary Examiner* — Ross N Gushi
(74) *Attorney, Agent, or Firm* — Harness, Dickey & Pierce, P.L.C.

(57) ABSTRACT

A memory card includes a substrate, first row terminals and second row terminals. The substrate has a first pair of side edges extending in a first direction and a second pair of side edges extending in a second direction perpendicular to the first direction. The first row terminals are arranged adjacent to an insertion side edge of the substrate, the first row terminals including a first power terminal, the insertion side edge being one of the first pair of side edges. The second row terminals are arranged further from the insertion side edge than the first row terminals, the second row terminals including a second power terminal. At least one recessed terminal among the first and second row terminals includes a recess area in an exposed surface of the at least one terminal.

10 Claims, 13 Drawing Sheets

(51) Int. Cl.
*H01R 12/70* (2011.01)
*H01R 13/24* (2006.01)

(52) U.S. Cl.
CPC ..... *H01R 13/2442* (2013.01); *H01R 13/2464* (2013.01); *H05K 1/11* (2013.01); *H05K 2201/094* (2013.01); *H05K 2201/09409* (2013.01); *H05K 2201/09445* (2013.01); *H05K 2201/09827* (2013.01); *H05K 2201/09863* (2013.01); *H05K 2201/10159* (2013.01)

(56) References Cited

U.S. PATENT DOCUMENTS

| | | | |
|---|---|---|---|
| 6,142,802 | A | 11/2000 | Berg et al. |
| 6,483,038 | B2 | 11/2002 | Lee et al. |
| 6,573,567 | B1 | 6/2003 | Nishizawa et al. |
| 6,634,561 | B1 | 10/2003 | Wallace |
| 6,945,465 | B2 | 9/2005 | Nishizawa et al. |
| 7,210,942 | B2 | 5/2007 | Uchida et al. |
| 7,232,315 | B2 | 6/2007 | Uchida et al. |
| 7,238,044 | B2 | 7/2007 | Uchida et al. |
| 7,261,569 | B2 | 8/2007 | Uchida et al. |
| 7,364,090 | B2 | 4/2008 | Cuellar et al. |
| 7,371,074 | B2 | 5/2008 | Uchida et al. |
| 7,487,265 | B2 | 2/2009 | Miller et al. |
| 7,497,695 | B2 | 3/2009 | Uchida et al. |
| 7,552,876 | B2 | 6/2009 | Nishizawa et al. |
| 7,646,085 | B2 | 1/2010 | Nishizawa et al. |
| 7,837,497 | B1 | 11/2010 | Matsuo et al. |
| 7,864,540 | B2 | 1/2011 | Takiar |
| 7,971,793 | B2 | 7/2011 | Nishizawa et al. |
| 8,102,657 | B2 | 1/2012 | Hiew et al. |
| 8,110,434 | B2 * | 2/2012 | Okada ............... H05K 1/0256 257/E21.5 |
| 8,567,050 | B2 | 10/2013 | Hiew et al. |
| 8,677,617 | B2 | 3/2014 | Beaman |
| 8,693,206 | B2 | 4/2014 | Kuster |
| 8,936,199 | B2 | 1/2015 | Lepp et al. |
| 8,976,533 | B2 | 3/2015 | Lin et al. |
| 8,998,620 | B2 | 4/2015 | Ni et al. |
| 9,004,950 | B2 | 4/2015 | Nakamura |
| 9,047,547 | B2 | 6/2015 | Okada |
| 9,075,924 | B2 | 7/2015 | Otsuka et al. |
| D739,856 | S | 9/2015 | Kang et al. |
| 9,213,492 | B2 | 12/2015 | Li et al. |
| 9,214,772 | B2 * | 12/2015 | Liu ..................... H01R 12/721 |
| 9,280,737 | B2 | 3/2016 | Lee et al. |
| 9,293,839 | B2 | 3/2016 | Nagamine |
| 9,293,854 | B2 | 3/2016 | Kang et al. |
| 9,313,891 | B2 | 4/2016 | Jung et al. |
| 9,332,641 | B2 | 5/2016 | Lee |
| 9,442,539 | B2 | 9/2016 | Stone et al. |
| 9,549,469 | B2 | 1/2017 | Beaman |
| D783,621 | S | 4/2017 | Lee et al. |
| D783,622 | S | 4/2017 | Lee et al. |
| 9,693,457 | B2 | 6/2017 | Beaman |
| 9,814,140 | B2 | 11/2017 | Beaman |
| 9,853,379 | B1 | 12/2017 | Hirose et al. |
| 9,898,437 | B2 | 2/2018 | Pinto et al. |
| 9,904,649 | B2 | 2/2018 | Pinto et al. |
| 10,037,784 | B2 | 7/2018 | Han et al. |
| 10,157,678 | B2 | 12/2018 | Han et al. |
| 10,224,110 | B2 | 3/2019 | Han et al. |
| 10,224,346 | B2 | 3/2019 | Jeong |
| 2003/0112613 | A1 | 6/2003 | Nishizawa et al. |
| 2005/0014298 | A1 | 1/2005 | Takiar |
| 2005/0037671 | A1 | 2/2005 | Yamada et al. |
| 2005/0105360 | A1 | 5/2005 | Takiar et al. |
| 2005/0111280 | A1 | 5/2005 | Takiar et al. |
| 2005/0148217 | A1 | 7/2005 | Takiar et al. |
| 2005/0281010 | A1 | 12/2005 | Wang et al. |
| 2006/0049265 | A1 | 3/2006 | Ho et al. |
| 2006/0084287 | A1 | 4/2006 | Miller et al. |
| 2006/0234521 | A1 | 10/2006 | Uchida et al. |
| 2006/0286858 | A1 | 12/2006 | Uchida et al. |
| 2006/0288146 | A1 | 12/2006 | Chen |
| 2007/0099511 | A1 | 5/2007 | Miller et al. |
| 2007/0258220 | A1 | 11/2007 | Chen et al. |
| 2007/0259567 | A1 | 11/2007 | Chen et al. |
| 2007/0267505 | A1 | 11/2007 | Chen |
| 2007/0270040 | A1 | 11/2007 | Jang et al. |
| 2007/0283053 | A1 | 12/2007 | Liu et al. |
| 2008/0025003 | A1 | 1/2008 | Nishizawa et al. |
| 2008/0065830 | A1 | 3/2008 | Aoki et al. |
| 2008/0173995 | A1 | 7/2008 | Kuratomi et al. |
| 2008/0191033 | A1 | 8/2008 | Cuellar et al. |
| 2008/0195817 | A1 | 8/2008 | Hiew et al. |
| 2008/0218799 | A1 | 9/2008 | Hiew et al. |
| 2008/0235939 | A1 | 10/2008 | Hiew et al. |
| 2008/0245877 | A1 | 10/2008 | Billebaud et al. |
| 2008/0248692 | A1 | 10/2008 | Ni et al. |
| 2008/0286990 | A1 | 11/2008 | Hiew et al. |
| 2009/0073665 | A1 | 3/2009 | Jow |
| 2009/0093136 | A1 | 4/2009 | Hiew et al. |
| 2009/0111522 | A1 | 4/2009 | Robles |
| 2009/0132763 | A1 | 5/2009 | Miller et al. |
| 2009/0254704 | A1 | 10/2009 | Nakamura et al. |
| 2009/0290274 | A1 | 11/2009 | Suenaga et al. |
| 2010/0072284 | A1 | 3/2010 | Nishizawa et al. |
| 2011/0003493 | A1 | 1/2011 | Mo et al. |
| 2011/0145465 | A1 | 6/2011 | Okada |
| 2012/0020151 | A1 | 1/2012 | Lin et al. |
| 2012/0117315 | A1 | 5/2012 | Okada |
| 2012/0200996 | A1 | 8/2012 | Kuster |
| 2013/0118783 | A1 | 5/2013 | Huang |
| 2013/0258576 | A1 | 10/2013 | Ben-Gad et al. |
| 2014/0127947 | A1 | 5/2014 | Han |
| 2015/0076237 | A1 | 3/2015 | Florek et al. |
| 2016/0049742 | A1 | 2/2016 | Han et al. |
| 2017/0118845 | A1 | 4/2017 | Shen et al. |
| 2017/0148492 | A1 * | 5/2017 | Han ..................... G11C 5/14 |
| 2017/0154003 | A1 | 6/2017 | Han et al. |
| 2017/0249545 | A1 | 8/2017 | Eymard et al. |
| 2017/0289127 | A1 | 10/2017 | Hendrick |
| 2018/0286466 | A1 | 10/2018 | Han et al. |
| 2018/0366847 | A1 | 12/2018 | Yu et al. |

FOREIGN PATENT DOCUMENTS

| | | |
|---|---|---|
| KR | 10-1641104 B1 | 7/2016 |
| KR | 10-1662031 B1 | 10/2016 |
| KR | 10-1741437 B1 | 5/2017 |
| KR | 2017-0103220 A | 9/2017 |

* cited by examiner

MEMORY CARD AND ELECTRONIC APPARATUS INCLUDING THE SAME

CROSS-REFERENCE TO RELATED APPLICATION

This application is a continuation of U.S. application Ser. No. 16/125,895, filed Sep. 10, 2018 which claims the benefit of Korean Patent Application No. 10-2018-0001384, filed on Jan. 4, 2018, in the Korean Intellectual Property Office, the disclosure of each of which is incorporated herein in its entirety by reference.

BACKGROUND

The inventive concepts relates to a memory card and an electronic apparatus including the memory card, and more particularly, to a memory card which may improve use of an area and enable stable power supply, and an electronic apparatus including the memory card.

Memory cards have been widely used in electronic apparatuses such as mobile phones, notebook computers, etc. because a memory card is capable of simply storing a large amount of information and is portable. Memory cards have various sizes to meet different needs. Memory cards having a smaller size, a faster storing speed, and a larger storage capacity have been developed and released to the market to cope with the demands for high speed, miniaturization, and high capacity. While memory specifications for a faster storage speed and a method of enabling stable power supply and operating at a fast speed while maintaining a compact size has lagged behind.

SUMMARY

The inventive concepts provides a memory card which may improve use of an area and enable stable power supply.

The inventive concepts provides an electronic apparatus including a memory card which may improve use of an area and enable stable power supply.

According to an aspect of the inventive concepts, there is provided a memory card including a substrate, first row terminals and second row terminals. The substrate has a first pair of side edges extending in a first direction and a second pair of side edges extending in a second direction perpendicular to the first direction. The first row terminals are arranged adjacent to an insertion side edge of the substrate, the first row terminals including a first power terminal, the insertion side edge being one of the first pair of side edges. The second row terminals are arranged further from the insertion side edge than the first row terminals, the second row terminals including a second power terminal. At least one terminal among the first and second row terminals includes a recess area in an exposed surface of the at least one terminal.

According to another aspect of the inventive concepts, there is provided a memory card including a substrate, first row terminals, second row terminals and third row terminals. The substrate has a first pair of side edges extending in a first direction and a second pair of side edges extending in a second direction perpendicular to the first direction. The first row terminals are arranged adjacent to an insertion side edge of the substrate and including a first power terminal, the insertion side edge being one of the first pair of side edges. The second row terminals are arranged further from the insertion side edge than the first row terminals and including a second power terminal and a first data terminal. The third row terminals are arranged further from the insertion side edge than the second row terminals and including a second data terminal. At least one terminal among the first, second, and third row terminals includes a recess area in an exposed surface of the at least one terminal.

According to another aspect of the inventive concepts, there is provided an electronic apparatus including a socket, a detachable tray, a memory card and socket pins. The tray is detachable from the socket and has an accommodation space configured to receive a memory card. The socket pins is configured to electrically connect to the memory card. The memory card includes a substrate, first row terminals and second row terminals. The substrate has a first pair of side edges extending in a first direction and a second pair of side edges extending in a second direction perpendicular to the first direction. The first row terminals are arranged adjacent to an insertion side edge of the substrate, the first row terminals including a first power terminal, the insertion side edge being one of the first pair of side edges. The second row terminals are arranged further from the insertion side edge than the first row terminals, the second row terminals including a second power terminal. Each terminal among the first and second row terminals includes a recess area in at least part of an exposed surface of the terminal among the first and second row terminals. The socket pins includes first row socket pin and second row socket pins, each of the first row socket pins including a head portion configured to electrically contact one of the first row terminals by being inserted in the recess area of the one of the first row terminals, each of the second row socket pins including a head portion configured to electrically contact one of the second row terminals by being inserted in the recess area of the one of the second row terminals.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
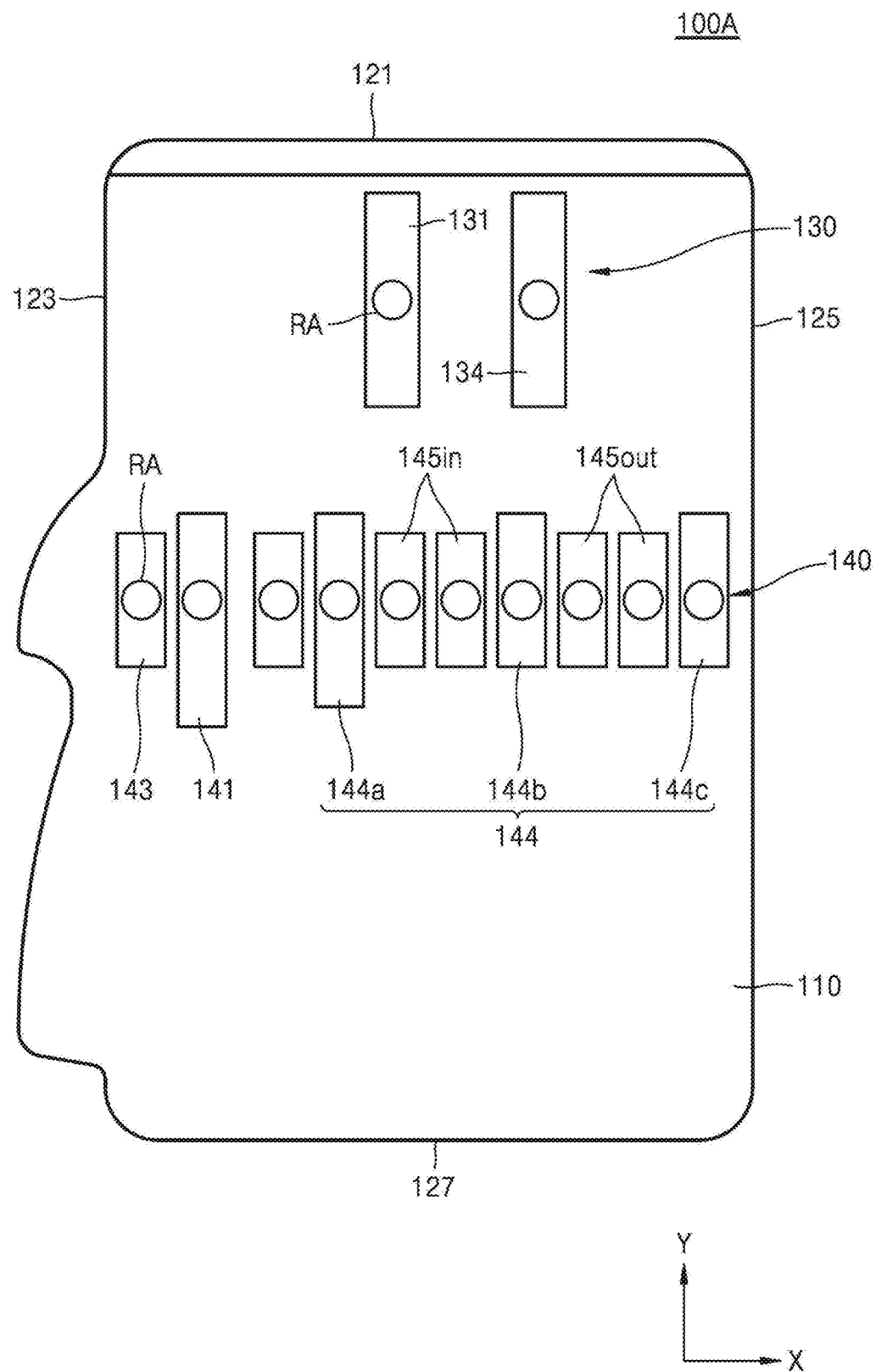
FIG. 1 is a plan view of a memory card according to an example embodiment.

FIG. 1 is a plan view of a memory card 100A according to another example embodiment.

Referring to FIG. 1, the memory card 100A may have two pairs of side edges facing each other. The two pairs of side edges may include an insertion side edge 121 in a direction in which the memory card 100A is inserted in a socket 200 (see FIG. 10), and a first side edge 123 and a second side edge 125 that are adjacent to the insertion side edge 121. Furthermore, the memory card 100A may include a third side edge 127 opposite to the insertion side edge 121. The insertion side edge 121 and the third side edge 127 may be parallel to each other.

The second side edge 125 may extend in a direction perpendicular to the direction in which the insertion side edge 121 extends. Furthermore, the second side edge 125 may extend only in a single direction. Furthermore, the first side edge 123 may include both a portion that is parallel to the second side edge 125 and a portion that is not parallel to the second side edge 125. For example, the first side edge 123 may include a laterally protruding portion with a shark's fin like shape.

The direction in which the insertion side edge 121 and the third side edge 127 extend may be referred to as a first direction (X direction), and the direction in which the first side edge 123 and the second side edge 125 extend may be referred to as a second direction (Y direction) perpendicular to the first direction (X direction).

There may be corners having a certain radius of curvature between the respective side edges 121, 123, 125, and 127. The corners may be identical to or different from one another.

The insertion side edge 121 may be a side located in a direction in which the memory card 100A is inserted into the socket 200. The insertion side edge 121 may enter the socket 200 first among the side edges 121, 123, 125, and 127 when the memory card 100A is inserted in the socket 200, and leave the socket 200 last among the respective side edges 121, 123, 125, and 127 when the memory card 100A is drawn from the socket 200. For the memory card 100A to smoothly enter the inside of the socket 200, the width of the insertion side edge 121 may be determined considering a certain allowable gap.

Terminals to electrically connect semiconductor devices in the memory card 100A to a host 1400 (see FIG. 12) may be arranged adjacent to the insertion side edge 121. The host 1400 may be an electronic apparatus, for example, mobile phones, desktop computers, notebook computers, tablet PCs, game machines, navigation devices, digital cameras, etc., but the present disclosure is not limited thereto. Furthermore, a memory card controller 1300 (see FIG. 12) for interfacing may be provided between the memory card 100A and the host 1400.

First row terminals 130 and second row terminals 140 may be arranged in two rows on a substrate 110, as illustrated in FIG. 1. In other words, the first and second row terminals 130 and 140 may be sequentially arranged in respective rows adjacent to the insertion side edge 121 of the substrate 110.

The first row terminals 130 may include a power terminal 131 of a first voltage. The first voltage may have a value between, for example, about 3.0 V to about 3.5 V. The first voltage may be supplied to semiconductor devices that perform a low speed operation among the semiconductor devices in the memory card 100A. For example, the first voltage may be supplied to a nonvolatile memory device 1101 (see FIG. 13) in the memory card 100A.

The second row terminals 140 may include a power terminal 141 of a second voltage. The second voltage may have a value between, for example, about 1.5 V to about 2.2 V. The second voltage may be supplied to semiconductor devices that perform a high speed operation among the semiconductor devices in the memory card 100A. For example, the second voltage may be supplied to a memory controller 1102 (see FIG. 13) in the memory card 100A.

Although not illustrated, one of ordinary skill in the art may understand connection wiring between the nonvolatile memory device 1101 and the power terminal 131 of the first voltage, and connection wiring between the memory controller 1102 and the power terminal 141 of the second voltage. The nonvolatile memory device 1101 and the memory controller 1102 may be connected to other constituent elements by wiring in various methods.

In the present example embodiment, since the first row terminals 130 are located closer to the insertion side edge 121 than the second row terminals 140, power may be supplied first to the first row terminals 130 rather than the second row terminals 140. In other words, as the memory card 100A is inserted in the socket 200, the power terminal 131 of the first voltage included in the first row terminals 130 may supply power of the first voltage in advance to the nonvolatile memory device 1101. Furthermore, since a ground terminal 134 is connected to the host 1400, power and a ground circuit for operating the whole memory card 100A are formed before the power is supplied to the memory controller 1102, thereby preparing an overall operation.

Although two first row terminals and ten second row terminals are respectively illustrated as the first and second row terminals 130 and 140, the number, position, and size of terminals are not limited thereto and may vary as necessary. Furthermore, some of the first and second row terminals 130 and 140, which are coated by a solder (SR) resist layer, may not be exposed to the outside. The terminals that are not exposed may be, for example, test terminals.

Each of the first and second row terminals 130 and 140 may have one or more ground terminals. For example, the first row terminals 130 may have the ground terminal 134, and the second row terminals 140 may have ground terminals 144.

Furthermore, the second row terminals 140 may include a pair of data input terminals 145in and a pair of data output terminals 145out. Although the data input terminals 145in are illustrated to be located closer to a center of the memory card 100A than the data output terminals 145out, the positions thereof may be switched with each other.

The data input terminals 145in may be electrically shielded by a pair of ground terminals 144a and 144b.

Furthermore, the data output terminals 145out may be electrically shielded by a pair of ground terminals 144b and 144c. Accordingly, data may be stably input or output due to the shielding.

Furthermore, the ground terminals 144a and 144b for shielding the data input terminals 145in and the ground terminals 144b and 144c for shielding the data output terminals 145out may share one ground terminal 144b. Contrarily, the ground terminals 144a and 144b for shielding the data input terminals 145in and the ground terminals 144b and 144c for shielding the data output terminals 145out may not share a ground terminal.

The data input terminals 145in may have the same dimensions. Furthermore, the data output terminals 145out may have the same dimensions. Furthermore, the data input terminals 145in and the data output terminals 145out may have the same dimensions.

In the second direction (Y direction) that is perpendicular to the insertion side edge 121, the data input terminals 145in may not extend further above or below from the ground terminals 144a and 144b, that is, the vertical length of each of the ground terminals 144a and 144b may be longer than that of the data input terminals 145in. Furthermore, in the second direction (Y direction), the data output terminals 145out may not extend further above or below the ground terminals 144b and 144c.

The length of the data input terminals 145in in the second direction (Y direction) may be less than the length of the ground terminals 144a and 144b in the second direction (Y direction). In particular, front ends of the ground terminals 144a and 144b toward the insertion side edge 121 may be closer to the insertion side edge 121 than front ends of the data input terminals 145in toward the insertion side edge 121.

The length of the data output terminals 145out in the second direction (Y direction) may be shorter than the length of the ground terminals 144b and 144c in the second direction (Y direction). In particular, front ends of the ground terminals 144b and 144c toward the insertion side edge 121 may be closer to the insertion side edge 121 than front ends of the data output terminals 145out toward the insertion side edge 121.

A distance from rear ends of the ground terminals 144a, 144b, and 144c, which are opposite to the front ends, to the insertion side edge 121, may be greater than or equal to a distance from rear ends of the data input terminals 145in and the data output terminals 145out to the insertion side edge 121.

A card detection terminal 143 may be arranged at a lateral side of the power terminal 141 of the second voltage. The card detection terminal 143 may be a terminal used for the host 1400 to identify a type of the memory card 100A. In particular, the card detection terminal 143 may be electrically connected to a ground line of the memory card 100A.

Since a grounded terminal is used as the card detection terminal 143, instead of a data input/output terminal, and the host 1400 receives a ground signal from a socket pin 240 (see FIG. 10) at the position of the card detection terminal 143 to identify a type of a card, accuracy in identification of a card type may be much increased, and thus an identification error may be reduced and a data input/output process to identify the card type may be omitted, thereby increasing an identification speed.

Although the card detection terminal 143 is arranged closest to the first side edge 123 among the second row terminals 140, and the power terminal 141 of the second voltage is arranged at the side of the card detection terminal 143, the card detection terminal 143 and the power terminal 141 of the second voltage may be positionally switched with each other.

Furthermore, the first and second row terminals 130 and 140 respectively may include at least one terminal having a recess area RA in at least part of an exposed surface of the terminal. The recess area RA may be formed in a concave recess shape at a center portion of each of the first and second row terminals 130 and 140. Furthermore, the recess area RA formed in each of the first and second row terminals 130 and 140 may be formed in the same shape. The shape of the recess area RA is described below in detail.

In a memory card in which an area of a substrate decreases and the number of terminal increases, an electrical contact defect such as open circuit or short circuit between a terminal and a socket pin may be generated. Also, in a structure of inserting a memory card placed on a tray in a socket of an electronic apparatus, an electrical contact defect is highly likely to be generated due to tolerance between the tray and the socket and tolerance between the memory card and the tray.

Accordingly, the memory card 100A according to the present inventive concepts includes at least one terminal having the recess area RA in at least part of the exposed surface of the terminal. Thus, misalignment and escape of socket pins 230 and 240 (see FIG. 10) respectively electrically contacting the first and second row terminals 130 and 140 may be reduced and an electrical contact defect may be prevented in advance.

Figure 2A:
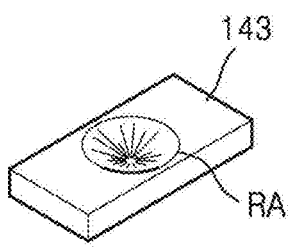
FIGS. 2A, 2B, and 2C, respectively, are a perspective view and a cross-sectional view of the memory card terminal of FIG. 1, and a cross-sectional view of the memory card terminal of FIG. 1 coupled to a socket pin.
Figure 2B:
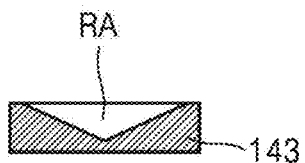
Figure 2C:
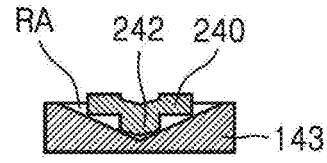

FIGS. 2A, 2B, and 2C respectively are a perspective view and a cross-sectional view of the memory card terminal of FIG. 1, and a cross-sectional view of the memory card terminal of FIG. 1 coupled to the socket pin 240.

Referring to FIGS. 2A, 2B, and 2C, FIG. 2A is a perspective view of the card detection terminal 143 that is one of the terminals forming the second row terminals 140, FIG. 2B is a cross-sectional view taken along the first direction (X direction of FIG. 1) of the card detection terminal 143, and FIG. 2C is a cross-sectional view illustrating that the card detection terminal 143 and the socket pin 240 are coupled to each other in electrical contact with each other.

Although the card detection terminal 143 is described as an example, for convenience of explanation, the above descriptions may be identically applied to the first and second row terminals 130 and 140 of FIG. 1 forming the first and second row terminals 130 and 140 of FIG. 1.

The card detection terminal 143 may include the recess area RA in at least part of the exposed surface of the card detection terminal 143. The recess area RA may be formed in a concave recess shape at a center portion of the card detection terminal 143. In other words, the exposed surface of the card detection terminal 143 is not formed flat, and may include a certain area having a different level on an upper surface. In some example embodiments, a side surface of the recess area RA may have a tapered shape. The recess area RA may be formed to be narrower toward a lower portion thereof. The recess area RA may have a cone shape.

As described above, while at least one of the terminals forming the second row terminals 140 may have a different length in the second direction (Y direction of FIG. 1), the center positions of the recess areas RA of the terminals may be aligned in the first direction (X direction of FIG. 1) to be parallel to one another. The recess area RA is where a head portion 242 of the socket pin 240 directly contacting the second row terminals 140 is placed. Accordingly, the socket pin 240 may include a plurality of socket pins in the same number as the number of the second row terminals 140, and the positions of the head portion 242 of the socket pin 240 may be aligned parallel to one another. To this end, the recess areas RA of the terminals may be aligned in the first direction (X direction of FIG. 1) to be parallel to one another.

As illustrated in FIG. 2C, the head portion 242 of the socket pin 240 may be coupled to the recess area RA to be placed therein. In other words, the socket pin 240 may be formed of an elastic material, and as the head portion 242 of the socket pin 240 is coupled to the recess area RA to be placed therein, misalignment and escape of the socket pin 240 from the card detection terminal 143 may be reduced, thereby preventing an electrical contact defect in advance.

Figure 3:
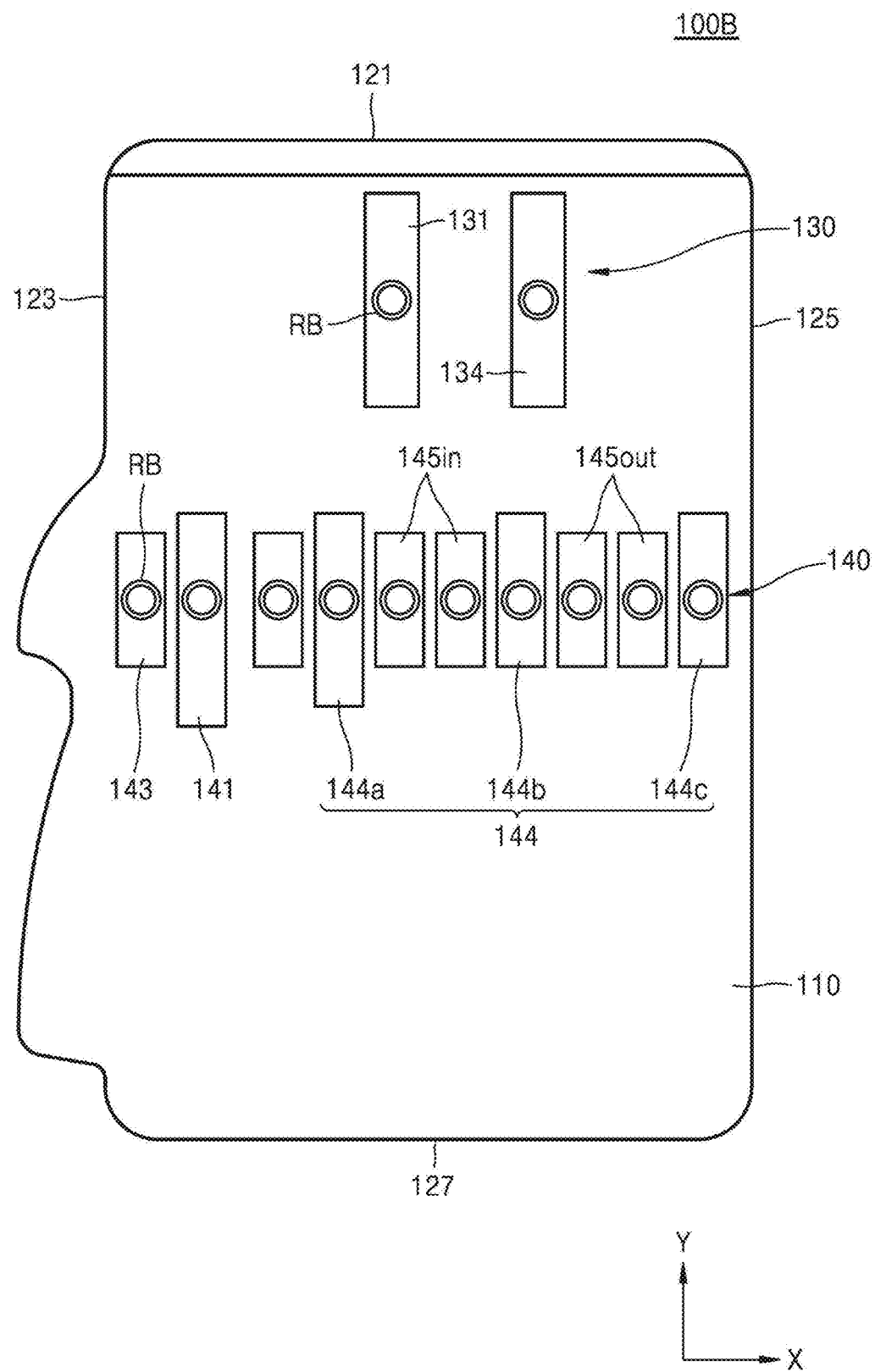
FIG. 3 is a plan view of a memory card according to another example embodiment.
Figure 4A:
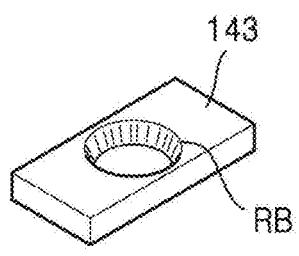
FIGS. 4A, 4B, and 4C, respectively, are a perspective view and a cross-sectional view of the memory card terminal of FIG. 3, and a cross-sectional view of the memory card terminal of FIG. 3 coupled to a socket pin.
Figure 4B:
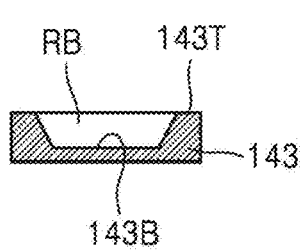
Figure 4C:
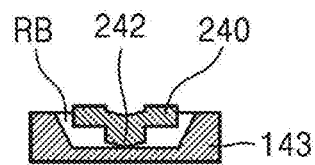

FIG. 3 is a plan view of a memory card 100B according to another example embodiment. FIGS. 4A, 4B, and 4C respectively are a perspective view and a cross-sectional view of a memory card terminal of FIG. 3, and a cross-sectional view of the memory card terminal of FIG. 3 coupled to the socket pin 240.

The memory card 100B is substantially the same as the memory card 100A of FIG. 1, except for the shape of a recess area RB. Accordingly, for convenience of explanation, redundant descriptions thereof are omitted.

Referring to FIG. 3 and FIGS. 4A, 4B, and 4C altogether, FIG. 4A is a perspective view of the card detection terminal 143 that is one of the terminals forming the second row terminals 140, FIG. 4B is a cross-sectional view taken along the first direction (X direction) of the card detection terminal 143, and FIG. 4C is a cross-sectional view illustrating that the card detection terminal 143 and the socket pin 240 are coupled to each other in electrical contact with each other.

Although the card detection terminal 143 is described as an example, for convenience of explanation, the above descriptions may be identically applied to the first and second row terminals 130 and 140 of FIG. 1 forming the first and second row terminals 130 and 140 of FIG. 1.

The card detection terminal 143 may include the recess area RB in at least part of the exposed surface of the card detection terminal 143. The recess area RB may be formed in a concave recess shape at the center portion of the card detection terminal 143. In other words, the exposed surface of the card detection terminal 143 is not formed as a flat surface, and may include a certain area having a different level on an upper surface. In some example embodiments, a side surface of the recess area RB may have a tapered shape. The recess area RB may be formed to be narrower toward a lower portion thereof. The recess area RB may have a truncated cone shape.

Surface roughness of a bottom surface 143B of the recess area RB that is exposed may be greater than surface roughness of a top surface 143T of the card detection terminal 143 that is exposed. In other words, after the card detection terminal 143, an additional etching process may be performed to form the recess area RB. In this case, physical etching equipment may be used, and the surface roughness of the bottom surface 143B of the recess area RB that is exposed may be increased by the etching process.

As illustrated in FIG. 4C, the head portion 242 of the socket pin 240 may be coupled to the recess area RB to be placed therein. In other words, the socket pin 240 may be formed of an elastic material, and as the head portion 242 of the socket pin 240 is coupled to the recess area RB to be placed therein, misalignment and escape of the socket pin 240 from the card detection terminal 143 may be reduced, thereby preventing an electrical contact defect in advance.

Furthermore, when the head portion 242 of the socket pin 240 is placed on the bottom surface 143B of the recess area RB, the socket pin 240 may be more stably coupled to the recess area RB as a frictional coefficient is high due to a difference in the surface roughness.

Figure 5:
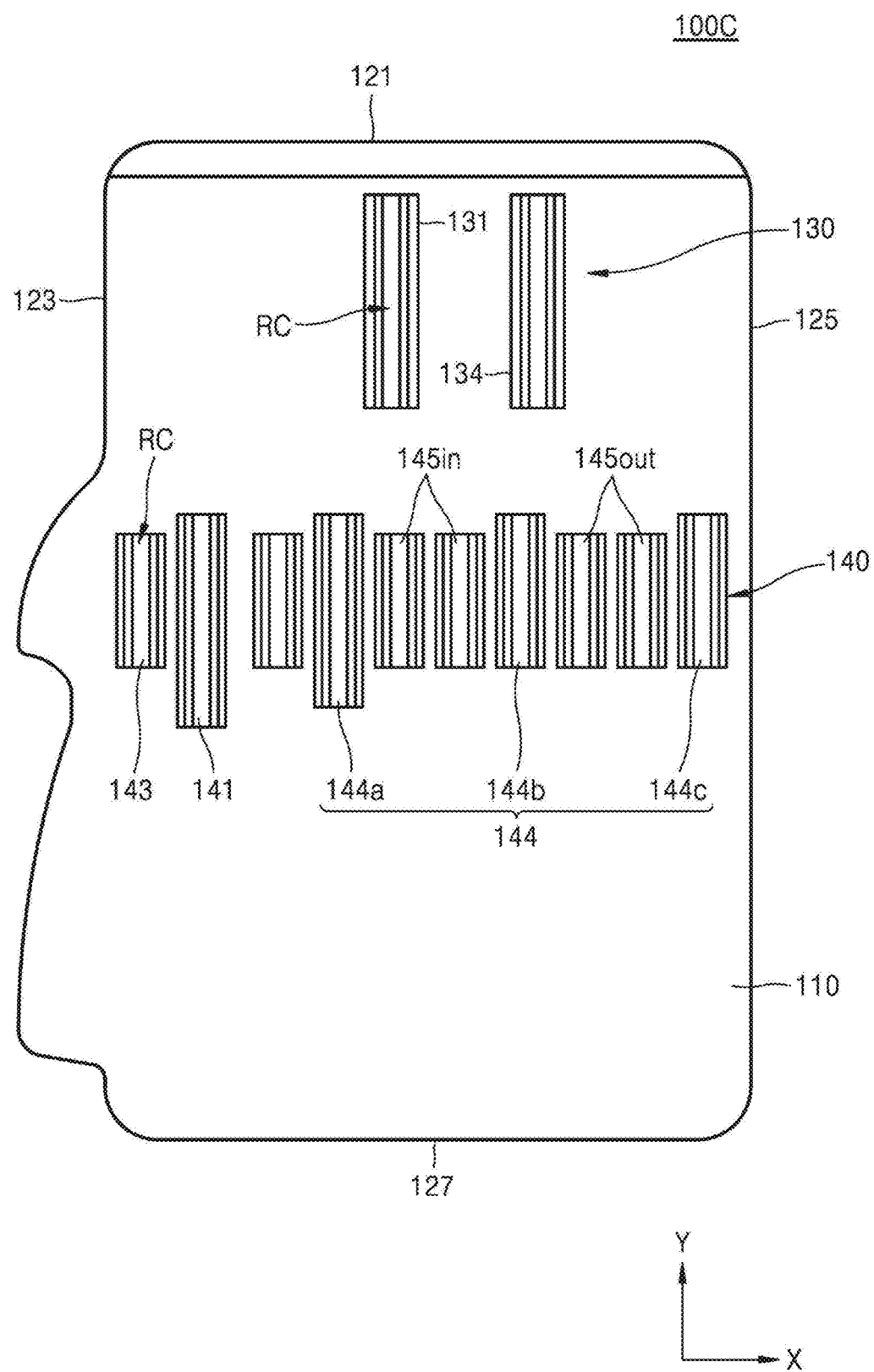
FIG. 5 is a plan view of a memory card according to another example embodiment.
Figure 6A:
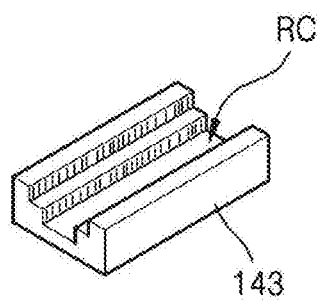
FIGS. 6A, 6B, and 6C, respectively, are a perspective view and a cross-sectional view of the memory card terminal of FIG. 5, and a cross-sectional view of the memory card terminal of FIG. 5 coupled to a socket pin.
Figure 6B:
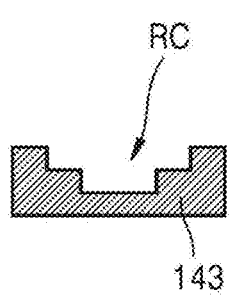
Figure 6C:
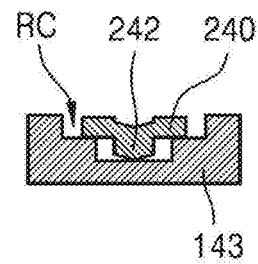

FIG. 5 is a plan view of a memory card 100C according to another example embodiment. FIGS. 6A, 6B, and 6C, respectively, are a perspective view and a cross-sectional view of the memory card terminal of FIG. 5, and a cross-sectional view of the memory card terminal of FIG. 5 coupled to the socket pin 240.

The memory card 100C is substantially the same as the memory card 100A of FIG. 1, except for the shape of a recess area RC. Accordingly, for convenience of explanation, redundant descriptions thereof are omitted.

Referring to FIG. 5 and FIGS. 6A, 6B, and 6C altogether, FIG. 6A is a perspective view of the card detection terminal 143 that is one of the terminals forming the second row terminals 140, FIG. 6B is a cross-sectional view taken along the first direction (X direction) of the card detection terminal 143, and FIG. 6C is a cross-sectional view illustrating that the card detection terminal 143 and the socket pin 240 are coupled to each other in electrical contact with each other.

Although the card detection terminal 143 is described as an example, for convenience of explanation, the above descriptions may be identically applied to the first and second row terminals 130 and 140 of FIG. 1 forming the first and second row terminals 130 and 140 of FIG. 1.

The card detection terminal 143 may include the recess area RC in at least part of the exposed surface of the card detection terminal 143. The recess area RC may be formed in a rail groove shape at the center portion of the card detection terminal 143. In other words, the exposed surface of the card detection terminal 143 is not formed as a flat surface, and may include a certain area having a different level on an upper surface. In some example embodiments, a side surface of the recess area RC may have a rail groove shape passing the center portion of the card detection terminal 143 in the second direction (Y direction). The recess area RC may have a side surface in the form of a staircase shape having at least one step. Although the recess area RC is illustrated as having two steps, the recess area RC may have one step or three or more steps.

As illustrated in FIG. 6C, the head portion 242 of the socket pin 240 may be coupled to the recess area RC to be placed therein. In other words, the socket pin 240 may be formed of an elastic material. As the head portion 242 of the socket pin 240 is coupled to the recess area RC to be placed therein, misalignment and escape of the socket pin 240 from the card detection terminal 143 may be reduced, thereby preventing an electrical contact defect in advance.

Furthermore, when the memory card 100C is inserted in the socket 200 via a tray 300 (see FIG. 10), the head portion 242 of the socket pin 240 is moved along the recess area RC having a rail groove shape to be aligned in the second direction (Y direction), and the recess area RC may serve as a guide on a movement path of the socket pin 240. In other words, from the insertion of the memory card 100C, misalignment and escape of the socket pin 240 from the card detection terminal 143 that the socket pin 240 electrically contacts may be reduced, thereby preventing an electrical contact defect in advance.

Figure 7:
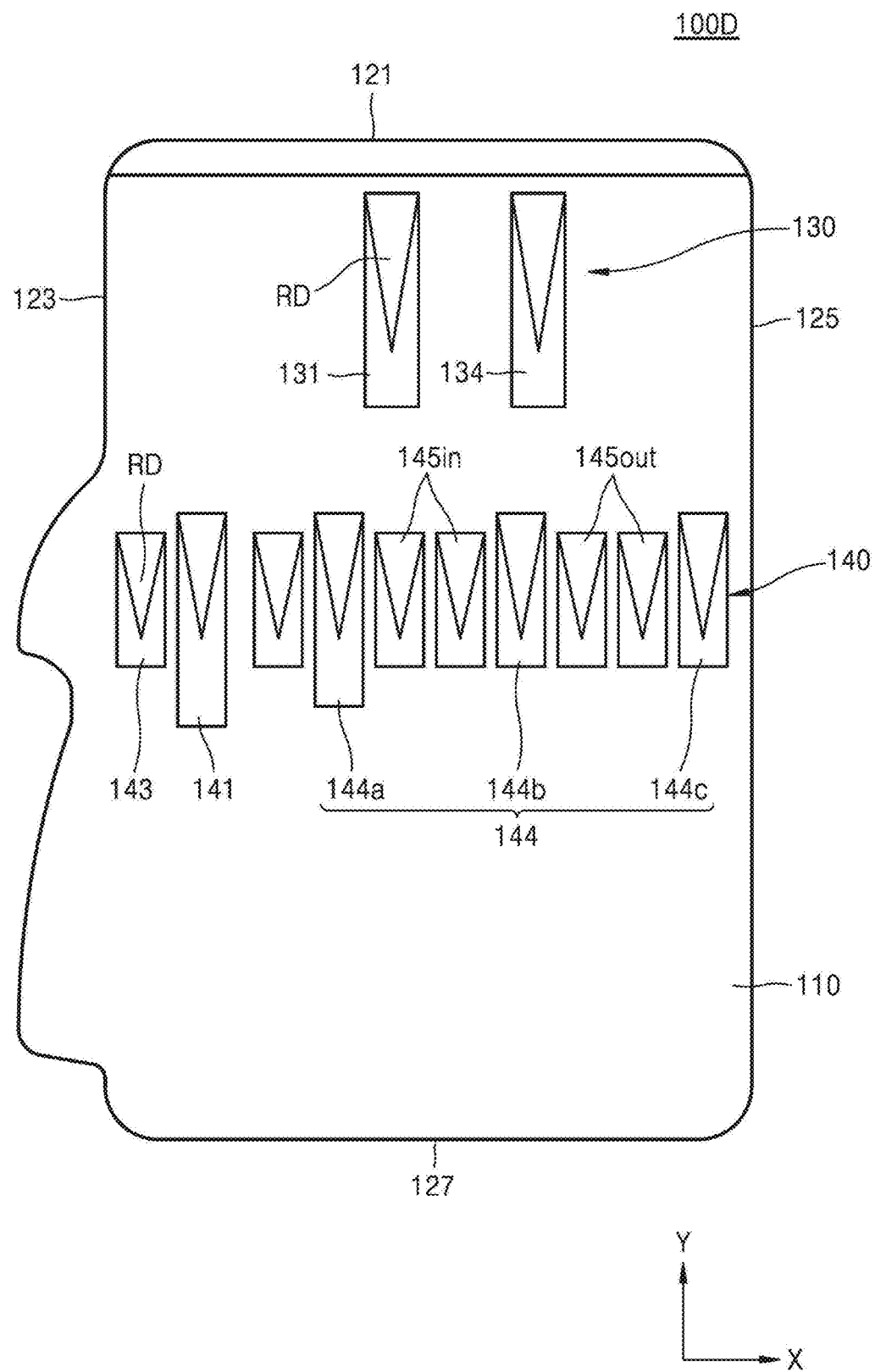
FIG. 7 is a plan view of a memory card according to another example embodiment.
Figure 8A:
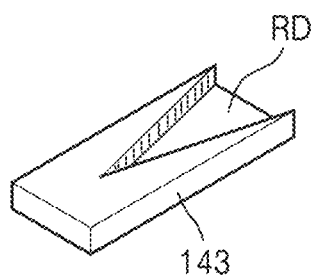
FIGS. 8A, 8B, and 8C, respectively, are a perspective view and a cross-sectional view of the memory card terminal of FIG. 7, and a cross-sectional view of the memory card terminal of FIG. 7 coupled to a socket pin.
Figure 8B:
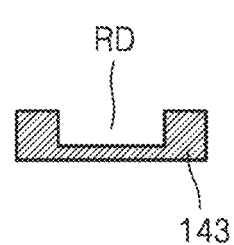
Figure 8C:
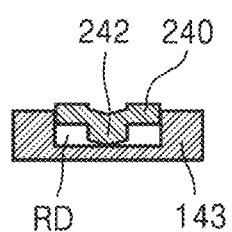

FIG. 7 is a plan view of a memory card 100D according to another example embodiment. FIGS. 8A, 8B, and 8C, respectively, are a perspective view and a cross-sectional view of the memory card terminal of FIG. 7, and a cross-sectional view of the memory card terminal of FIG. 7 coupled to the socket pin 240.

The memory card 100D is substantially the same as the memory card 100A of FIG. 1, except for the shape of a recess area RD. Accordingly, for convenience of explanation, redundant descriptions thereof are omitted.

Referring to FIG. 7 and FIGS. 8A, 8B, and 8C altogether, FIG. 8A is a perspective view of the card detection terminal 143 that is one of the terminals forming the second row terminals 140, FIG. 8B is a cross-sectional view taken along the first direction (X direction) of the card detection terminal 143, and FIG. 8C is a cross-sectional view illustrating that the card detection terminal 143 and the socket pin 240 are coupled to each other in electrical contact with each other.

Although the card detection terminal 143 is described as an example, for convenience of explanation, the above descriptions may be identically applied to the first and second row terminals 130 and 140 of FIG. 1 forming the first and second row terminals 130 and 140 of FIG. 1.

The card detection terminal 143 may include the recess area RD in at least part of the exposed surface of the card detection terminal 143. The recess area RD may have a wedge recess shape in part of the card detection terminal 143. In other words, the exposed surface of the card detection terminal 143 is not formed as a flat surface, and may include a certain area having a different level on an upper surface. In some example embodiments, the recess area RD may have a wedge recess shape having a width in the first direction (X direction) decreasing along the second direction (Y direction) of the card detection terminal 143 away from the insertion side edge 121.

In other words, the width of the recess area RD in the first direction (X direction) increases in an area close to the insertion side edge 121, and the width of the recess area RD in the first direction (X direction) decreases in an area far from the insertion side edge 121.

As illustrated in FIG. 8C, the head portion 242 of the socket pin 240 may be coupled to the recess area RD to be placed therein. In other words, the socket pin 240 may be formed of an elastic material. As the head portion 242 of the socket pin 240 is coupled to the recess area RD to be placed therein, misalignment and escape of the socket pin 240 from the card detection terminal 143 may be reduced, thereby preventing an electrical contact defect in advance.

Furthermore, when the memory card 100D is inserted in the socket 200 via the tray 300, the head portion 242 of the socket pin 240 is moved along the recess area RD having a wedge recess shape to be aligned in the second direction (Y direction), and the recess area RD may serve as a guide on a movement path of the socket pin 240. In other words, from the insertion of the memory card 100D, misalignment and escape of the socket pin 240 from the card detection terminal 143 that the socket pin 240 electrically contacts may be reduced, thereby preventing an electrical contact defect in advance.

Figure 9:
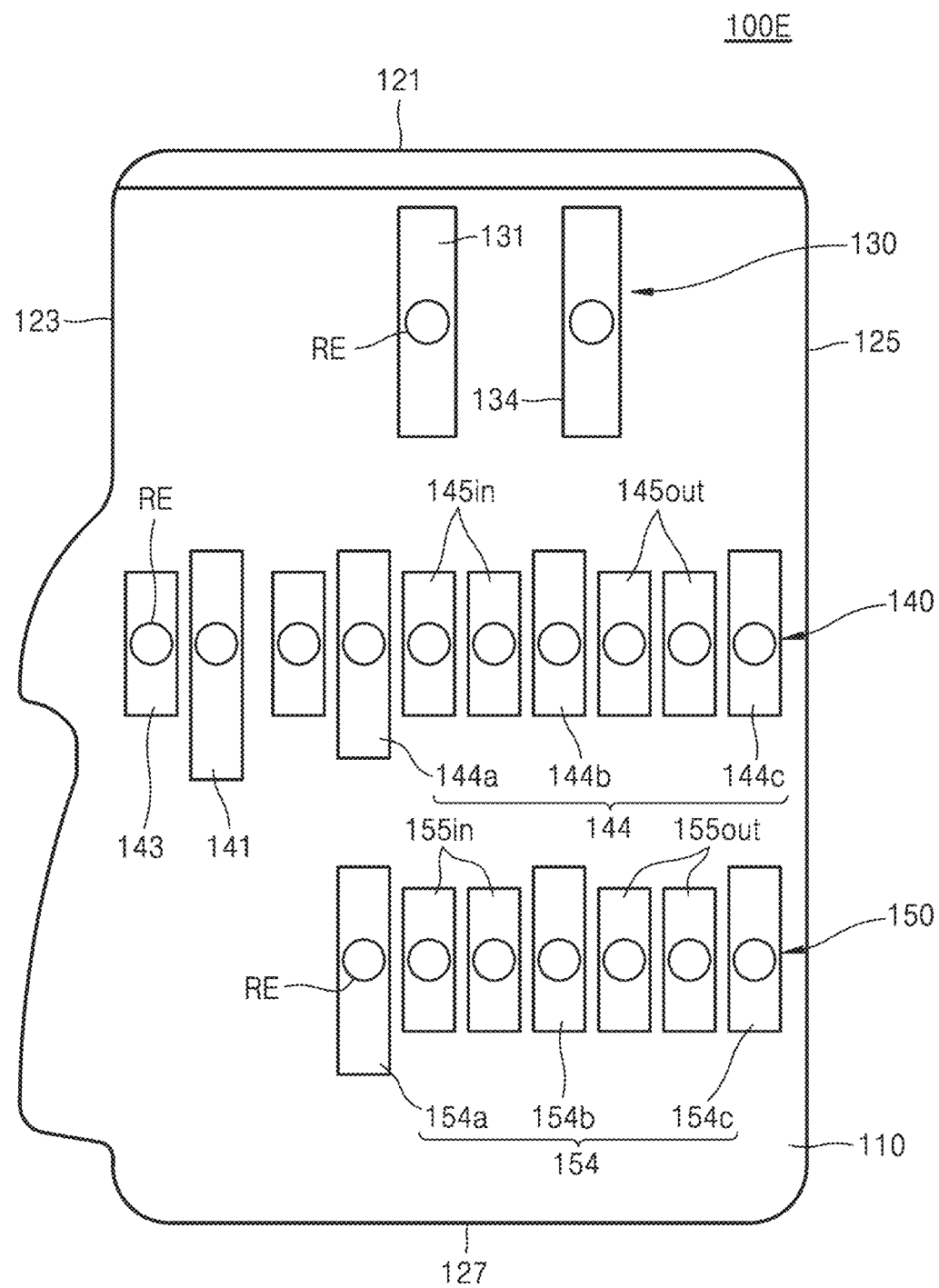
FIG. 9 is a plan view of a memory card according to another example embodiment.

FIG. 9 is a plan view of a memory card 100E according to another example embodiment.

Referring to FIG. 9, the substrate 110 may include the first row terminals 130 arranged adjacent to the insertion side edge 121, the second row terminals 140 arranged spaced further from the insertion side edge 121 than the first row terminals 130, and third row terminals 150 arranged spaced further from the insertion side edge 121 than the second row terminals 140.

Since the first and second row terminals 130 and 140 are substantially the same as those of the memory card 100A of FIG. 1, for convenience of explanation, redundant descriptions thereof are omitted.

The third row terminals 150 may include ground terminals 154. Furthermore, the third row terminals 150 may include a pair of second data input terminals 155in and a pair of second data output terminals 155out. Although the second data input terminals 155in are illustrated to be located closer to a center of the memory card 100E than the second data output terminals 155out, the positions thereof may be switched with each other.

The second data input terminals 155in may be electrically shielded by a pair of ground terminals 154a and 154b. Furthermore, the second data input terminals 155in may be electrically shielded by the ground terminals 154a and 154b. Accordingly, data may be stably input or output due to the shield.

Furthermore, the ground terminals 154a and 154b for shielding the second data input terminals 155in and the ground terminals 154b and 154c for shielding the second data output terminals 155out may share one ground terminal 154b. Contrarily, the ground terminals 154a and 154b for shielding the second data input terminals 155in and the ground terminals 154b and 154c for shielding the second data output terminals 155out may share no ground terminal.

The second data input terminals 155in may have the same dimensions. Furthermore, the second data output terminals 155out may have the same dimensions. Furthermore, the second data input terminals 155in and the second data output terminals 155out may have the same dimensions.

In the second direction (Y direction) that is perpendicular to the insertion side edge 121, the second data input terminals 155in may not escape further from the ground terminals 154a and 154b, that is, the vertical length of each of the ground terminals 154a and 154b is longer than that of the second data input terminals 155in. Furthermore, in the second direction (Y direction), the second data output terminals 155out may not escape from the ground terminals 154b and 154c.

The length of the second data input terminals 155in in the second direction (Y direction) may be shorter than the length of the ground terminals 154a and 154b in the second direction (Y direction). In particular, front ends of the ground terminals 154a and 154b toward the insertion side edge 121 may be closer to the insertion side edge 121 than front ends of the second data input terminals 155in toward the insertion side edge 121.

The length of the second data output terminals 155out in the second direction (Y direction) may be shorter than the length of the ground terminals 154b and 154c in the second direction (Y direction). In particular, front ends of the ground terminals 154b and 154c toward the insertion side edge 121 may be closer to the insertion side edge 121 than front ends of the second data output terminals 155out toward the insertion side edge 121.

A distance from rear ends of the ground terminals 154a, 154b, and 154c, which are opposite to the front ends, to the insertion side edge 121, may be greater than or equal to a distance from rear ends of the second data input terminals 155in and the second data output terminals 155out to the insertion side edge 121.

Furthermore, the first, second, and third row terminals 130, 140, and 150 respectively may include at least one terminal having a recess area RE in at least part of the exposed surface of the terminal. The recess area RE may be formed in one of a cone shape, a truncated cone shape, a rail groove shape, and a wedge recess shape at the center portion of each of the first, second, and third row terminals 130, 140, and 150. Furthermore, the recess area RE formed in each of the first, second, and third row terminals 130, 140, and 150 may be formed in the same shape. Since the shape of the recess area RE is the same as that described above, a detailed description thereof is omitted for convenience of explanation.

Figure 10:
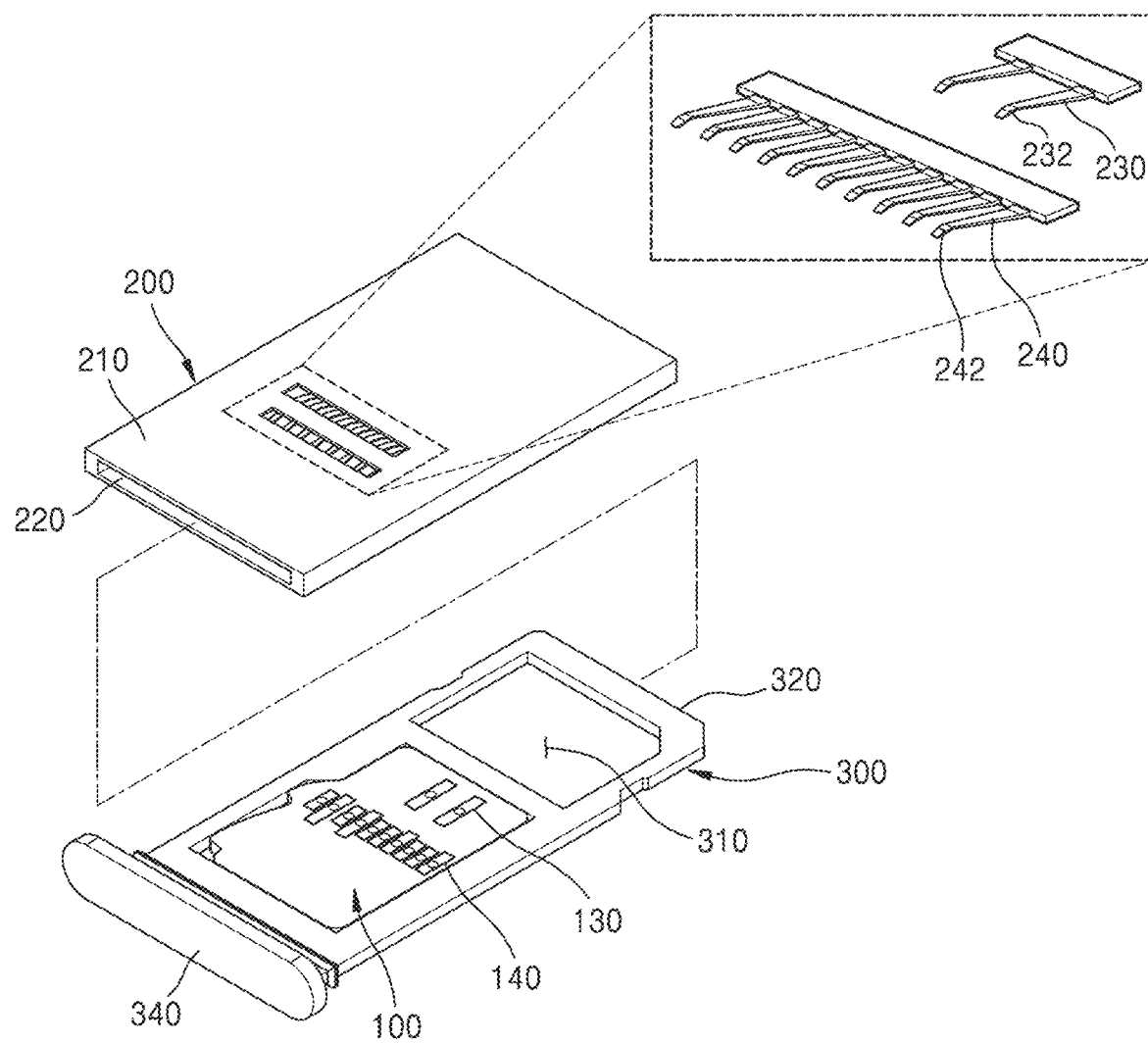
FIG. 10 is a perspective view schematically illustrating a process of coupling a memory card according to an example embodiment to a socket.

FIG. 10 is a perspective view schematically illustrating a process of coupling a memory card 100 according to an example embodiment to a socket 200.

Referring to FIG. 10, an electronic apparatus 10 according to an example embodiment may include the memory card 100, the tray 300, and the socket 200. The memory card 100 may include one of the memory cards 100A, 100B, 100C, 100D, and 100E according to the above-described example embodiments.

The tray 300 may include an insertion portion 320 slidably inserted in an entrance 220 of the socket 200, and an exposed portion 340 provided outside the electronic apparatus 10 opposite to the insertion portion 320 when the insertion portion 320 of the tray 300 is inserted in the entrance 220 of the socket 200. Furthermore, the tray 300 may further include an accommodation portion 310 for accommodating various cards including the memory card 100. The accommodation portion 310 may include a plurality of accommodation portions having various other shapes to accommodate a plurality of cards.

The socket 200 may include first row matching socket pins 230 corresponding to the first row terminals 130 of the memory card 100, second row matching socket pins 240 corresponding to the second row terminals 140 of the memory card 100, and a housing 210 for accommodating the first row matching socket pins 230 and the second row matching socket pins 240.

The memory card 100 may be operated as the memory card 100 is inserted in the housing 210 and thus the first row matching socket pins 230 and the second row matching socket pins 240 contact with each other.

In some example embodiments, although the first row terminals 130 are illustrated as having two first row terminals, the first row matching socket pins 230 may include three or more first row matching socket pins to identify and use various shapes of memory cards.

Furthermore, in some example embodiments, although the second row terminals 140 are illustrated as having ten second row terminals, the second row matching socket pins 240 may include eleven or more second row matching socket pins to identify and use various shapes of memory cards. One of ordinary skill in the art may understand that the numbers of the socket pins 230 and 240 included in the socket 200 are not limited thereto.

In some example embodiments, when the memory card 100 includes a third row terminal (not shown), the socket 200 may further include third row matching socket pins (not shown).

Figure 11A:
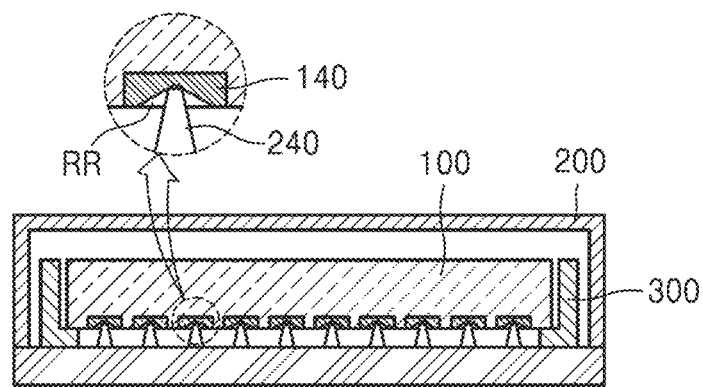
FIGS. 11A and 11B are cross-sectional views showing a coupling state of the memory card and the socket.
Figure 11B:
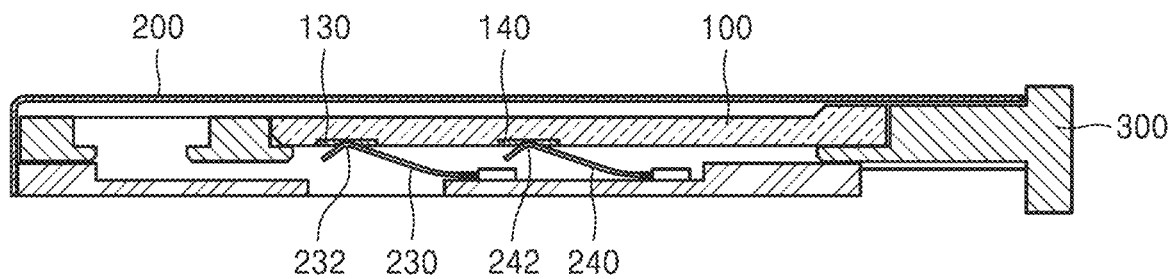

FIGS. 11A and 11B are cross-sectional views showing a coupling state of a memory card according to an example embodiment and the socket 200.

FIG. 11A is a cross-sectional view taken along the first direction (X direction of FIG. 1) in which the head portions 242 of the second row matching socket pins 240 are aligned. FIG. 11B is a cross-sectional view taken along the second direction (Y direction of FIG. 1) in which the first row matching socket pins 230 and the second row matching socket pins 240 are aligned.

Referring to FIGS. 11A and 11B, the electronic apparatus 10 may include the socket 200, the tray 300 that is detachable from the socket 200 and has the accommodation portion 310, the memory card 100 placed in the accommodation portion 310, and the socket pins 230 and 240 electrically connected to the memory card 100. The memory card 100 may include any one of the memory cards 100A, 100B, 100C, 100D, and 100E according to the above-described example embodiment.

In a process of placing the tray 300 in the socket 200, the head portions 232 and 242 of the socket pins 230 and 240 are moved to electrically contact the first and second row terminals 130 and 140 by being inserted in recess areas RR of the first and second row terminals 130 and 140 of the memory card 100, and the recess area RR of the memory card 100 may have any one of a cone shape, a truncated cone shape, a rail groove shape, and a wedge recess shape. In other words, the recess area RR may include any one of the recess areas RA, RB, RC, and RD.

The head portion 242 of the socket pin 240 may be placed in the recess area RR. In other words, the socket pin 240 may be formed of an elastic material. As the head portion 242 of the socket pin 240 is placed in the recess area RR, misalignment and escape of the socket pin 240 from the card detection terminal 143 may be reduced, thereby preventing an electrical contact defect in advance.

In particular, when the recess area RR has a rail groove shape or a wedge recess shape, in the process of placing the tray 300 in the socket 200, the head portion 242 of the socket pin 240 is moved along the recess area RR of the memory card 100. In other words, when the memory card 100 is inserted in the socket 200 through the tray 300, the head portion 242 of the socket pin 240 is moved along the recess area RR, the recess area RR may serve as a guide on a movement path of the socket pin 240. In other words, misalignment and escape of the socket pin 240 from the card detection terminal 143 that the socket pin 240 electrically contacts since the insertion of the memory card 100 may be reduced, thereby preventing an electrical contact defect in advance.

Figure 12:
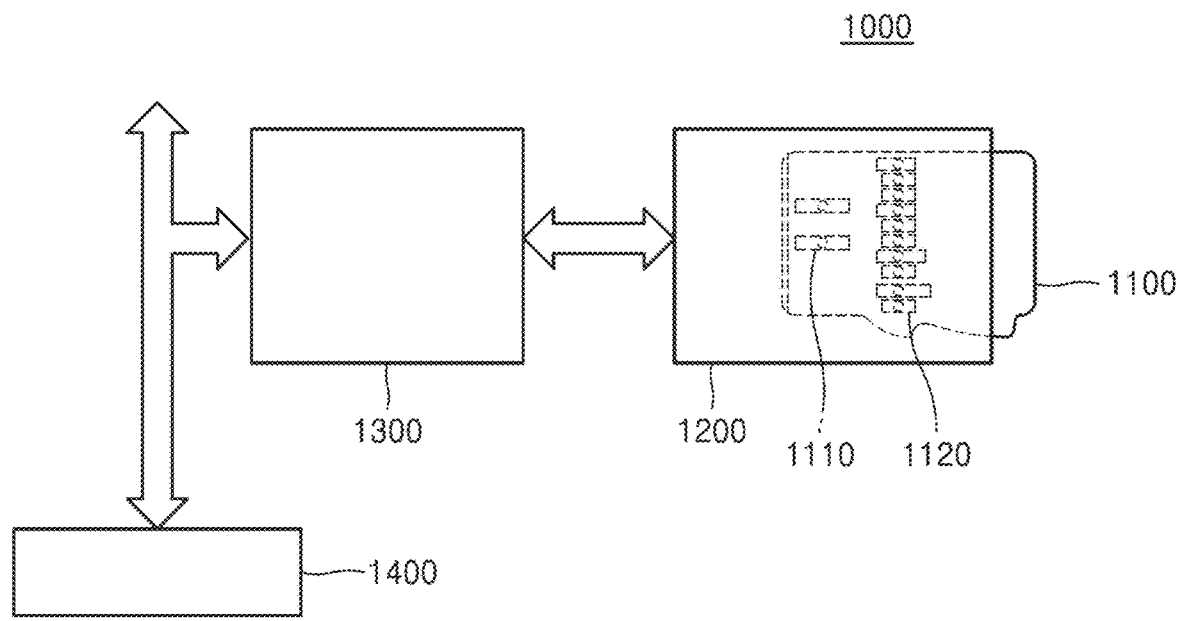
FIG. 12 is a schematic view of a system using a memory card according to an example embodiment.

FIG. 12 is a schematic view of a system 1000 using a memory card 1100 according to an example embodiment.

Referring to FIG. 12, the system 1000 may include the memory card 1100, a socket 1200, a memory card controller 1300, and a host 1400. The memory card 1100 may include any one of the memory cards 100A, 100B, 100C, 100D, and 100E according to the above-described example embodiments. The socket 1200, in which the memory card 1100 is inserted, may include socket pins (not shown) electrically connected to first row terminals 1110 and second row terminals 1120 of the memory card 1100. The memory card controller 1300 may control data exchange with the memory card 1100 via the socket 1200. The memory card controller 1300 may be used to store data in the memory card 1100. The host 1400 may control the memory card controller 1300. The host 1400 may be an electronic apparatus, for example, mobile phones, desktop computers, notebook computers, tablet PCs, game machines, navigation devices, digital cameras, etc., but not limited thereto.

Figure 13:
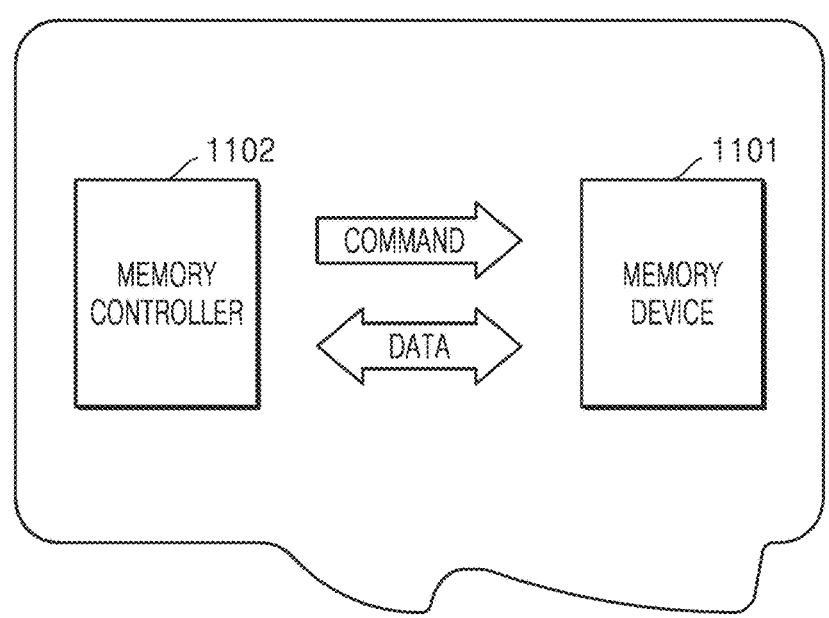
FIG. 13 is a schematic view of a configuration of a memory card according to an example embodiment.

FIG. 13 is a schematic view of a configuration of the memory card 1100, according to an example embodiment.

Referring to FIG. 13, in the memory card 1100, a memory device 1101 and a memory controller 1102 may be configured to exchange electrical signals. For example, when the memory controller 1102 issues a command, the memory device 1101 may transmit data. The memory device 1101 may include a memory array or a memory array bank (not shown). The memory card 1100 may include any one of the memory cards 100A, 100B, 100C, 100D, and 100E according to the above-described example embodiments.

Figure 14:
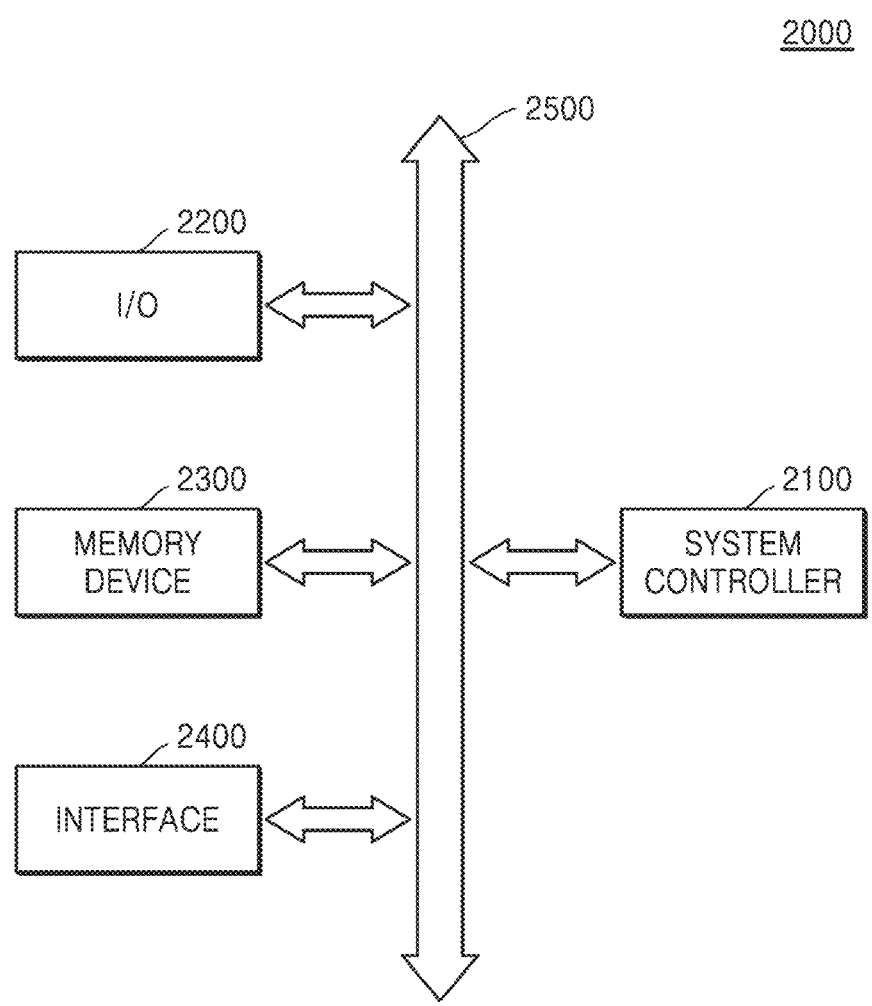
FIG. 14 is a block diagram of an electronic system including a memory card according to an example embodiment.

FIG. 14 is a block diagram of an electronic system 2000 including a memory card according to an example embodiment.

Referring to FIG. 14, the electronic system 2000 may include a system controller 2100, an input/output device 2200, a memory device 2300, an interface 2400, and a bus 2500. The system controller 2100, the input/output device 2200, the memory device 2300, and/or the interface 2400 may be electrically coupled to one another via the bus 2500. The bus 2500 corresponds to a path through which data is transferred.

The system controller 2100 may include at least one of a microprocessor, a digital signal processor, a microcontroller, and logic elements capable of performing similar functions. The input/output device 2200 may include a keypad, a keyboard, a touch pad, a touch screen, and a display apparatus. The memory device 2300 may store data and/or commands. The memory device 2300 may include any one of the memory cards 100A, 100B, 100C, 100D, and 100E according to the above-described example embodiments. Furthermore, the memory device 2300 may further include a memory device of a different type. The interface 2400 may perform a function of transmitting data or receiving data via a communication network. The interface 2400 may be of a wired or wireless type. For example, the interface 2400 may include an antenna or a wired/wireless transceiver. The electronic system 2000 may further include an operational memory device (not shown) to improve an operation of the system controller 2100.

The electronic system 2000 may be applied to mobile phones, desktop computers, notebook computers, tablet PCs, game machines, navigation devices, digital cameras, or all electronic apparatuses capable of transmitting and/or receiving information in a wired/wireless environment.

While the inventive concepts have been particularly shown and described with reference to example embodiments thereof, it will be understood that various changes in form and details may be made therein without departing from the spirit and scope of the following claims.

What is claimed is:

1. A memory card comprising:
   a substrate having a first pair of side edges extending in a first direction and a second pair of side edges extending in a second direction perpendicular to the first direction; and
   terminals arranged adjacent to an insertion side edge of the substrate, the insertion side edge being one of the first pair of side edges,
   wherein at least one recessed terminal from among the terminals includes non-recessed portions along the first direction on either side of a recess area in an exposed surface of the at least one terminal,
   wherein the recess area has a recess shape that is at least one of a concave cone shape, a concave truncated cone shape having a radius decreasing toward a bottom thereof, or a rail groove shape passing through a center portion of the at least one recessed terminal in the second direction, the rail groove shape having a side surface having a staircase shape having at least one step.

2. The memory card of claim 1, wherein the recess shape is one of concave cone shape or the concave truncated cone shape, and
   wherein a side surface of the recess shape is tapered.

3. The memory card of claim 1, wherein the recess shape is the concave truncated cone shape, and
   wherein surface roughness of an exposed bottom surface of the recess shape is greater than surface roughness of an exposed upper surface of the at least one recessed terminal, the exposed surface including the exposed bottom surface and the exposed upper surface.

4. The memory card of claim 1, wherein at least one terminal from among the terminals has a different length from others of the terminals in the second direction,
   each of the terminals respectively includes the recess area having the recess shape, and
   center portions of the recess shapes of the terminals are parallel to one another in the first direction.

5. A memory card comprising:
   a substrate having a first pair of side edges extending in a first direction and a second pair of side edges extending in a second direction perpendicular to the first direction;
   first row terminals arranged adjacent to an insertion side edge of the substrate, the insertion side edge being one of the first pair of side edges; and
   second row terminals arranged further from the insertion side edge than the first row terminals,
   wherein at least one recessed terminal from among the first and second row terminals includes non-recessed portions along the first direction on either side of a recess area in an exposed surface of the at least one recessed terminal, and
   wherein the recess area has a recess shape that is at least one of a concave cone shape, a concave truncated cone shape having a radius decreasing toward a bottom thereof, or a rail groove shape passing through a center portion of the at least one recessed terminal in the second direction, the rail groove shape having a side surface having a staircase shape having at least one step.

6. The memory card of claim 5, further comprising:
   a nonvolatile memory device; and
   a memory controller,
   wherein a power terminal of first row terminals supplies power to the nonvolatile memory device, and a power terminal of second row terminals supplies power to the memory controller.

7. An electronic apparatus comprising:
   a socket comprising socket pins;
   a tray detachable from the socket and comprising an accommodation space; and
   a memory card,
   wherein the memory card is received in the accommodation space and configured to be electrically connected to the socket pins,
   wherein the memory card includes,
      a substrate having a first pair of side edges extending in a first direction and a second pair of side edges extending in a second direction perpendicular to the first direction; and
      terminals arranged adjacent to an insertion side edge of the substrate,
   the insertion side edge being one of the first pair of side edges,
   wherein each of the terminals includes non-recessed portions along the first direction on either side of a recess area in at least part of an exposed surface, and
   wherein each of the socket pins includes a head portion configured to electrically contact a respective one of the terminals when inserted in the recess area of the respective one of the terminals, and wherein the recess area has a recess shape that is at least one of a concave cone shape, a concave truncated cone shape having a radius decreasing toward a bottom thereof, or a rail groove shape passing through a center portion of the terminal in the second direction, the rail groove shape having a side surface having a staircase shaving at least one step.

8. The electronic apparatus of claim 7, wherein the recess area of each of the terminals has a concave recess shape, and
wherein, when the tray is inserted in the socket, the head portion of each of the socket pins is moved to be inserted in the concave recess shape of the respective one of the terminals.

9. The electronic apparatus of claim 7, wherein the recess area of each of the terminals has the rail groove shape passing through a center portion of the terminals in the second direction, and
wherein, when the tray is inserted in the socket, the head portion of each of the socket pins is moved along the rail groove shape of the respective one of the terminals.

10. The electronic apparatus of claim 7, wherein the memory card further includes second terminals arranged further from the insertion side edge than the terminals, each of the second terminals including a recess area in an exposed surface of each of the second terminals, and
wherein the socket pins further include second socket pins, each of the second socket pins including a head portion configured to electrically contact a respective one of the second terminals when inserted in the recess area of the respective one of the second terminals.

* * * * *